(12) United States Patent
Yamada et al.

(10) Patent No.: US 9,841,171 B2
(45) Date of Patent: Dec. 12, 2017

(54) LIGHT-EMITTING DEVICE AND LIGHTING APPLIANCE INCLUDING THE LIGHT-EMITTING DEVICE

(71) Applicants: CITIZEN ELECTRONICS CO., LTD., Yamanashi-ken (JP); CITIZEN WATCH CO., LTD., Tokyo (JP)

(72) Inventors: Tatsuro Yamada, Fujiyoshida (JP); Takashi Akiyama, Sayama (JP)

(73) Assignees: CITIZEN ELECTRONICS CO., LTD., Yamanashi-Ken (JP); CITIZEN WATCH CO., LTD., Tokyo (JP)

( * ) Notice: Subject to any disclaimer, the term of this patent is extended or adjusted under 35 U.S.C. 154(b) by 26 days.

(21) Appl. No.: 15/134,463

(22) Filed: Apr. 21, 2016

(65) Prior Publication Data

US 2016/0319997 A1 Nov. 3, 2016

Related U.S. Application Data

(60) Provisional application No. 62/155,660, filed on May 1, 2015.

(51) Int. Cl.
| | |
|---|---|
| *B60Q 3/04* | (2006.01) |
| *F21V 23/00* | (2015.01) |
| *F21K 9/23* | (2016.01) |
| *H05K 1/18* | (2006.01) |
| *F21V 23/02* | (2006.01) |
| *F21Y 115/10* | (2016.01) |
| *H05K 1/02* | (2006.01) |

(52) U.S. Cl.
CPC ............ *F21V 23/005* (2013.01); *F21K 9/23* (2016.08); *H05K 1/181* (2013.01); *F21V 23/02* (2013.01); *F21Y 2115/10* (2016.08); *H05K 1/0263* (2013.01); *H05K 2201/10015* (2013.01); *H05K 2201/10106* (2013.01); *Y02P 70/611* (2015.11)

(58) Field of Classification Search
CPC .......... F21K 9/23; F21V 23/005; F21V 23/02; F21Y 2115/10; H05K 1/0263; H05K 1/181; H05K 2201/10015; H05K 2201/10106
USPC ....................................... 362/362
See application file for complete search history.

(56) References Cited

U.S. PATENT DOCUMENTS

| 8,500,316 B2* | 8/2013 | Hisayasu | F21V 19/0055 362/249.02 |
|---|---|---|---|
| 2012/0187836 A1* | 7/2012 | Hashimoto | F21V 5/04 315/51 |
| 2013/0294085 A1 | 11/2013 | Watanabe et al. | |

* cited by examiner

*Primary Examiner* — Seung Lee
(74) *Attorney, Agent, or Firm* — Wenderoth, Lind & Ponack, L.L.P.

(57) ABSTRACT

In a first aspect of the present inventive subject matter, a light-emitting device includes a substrate; a light-emitting element electrically connected to the substrate and arranged in a light-emitting area that is positioned on an upper surface of the substrate; and an electronic part that is electrically connected to the substrate and arranged outside the light-emitting area on the upper surface of the substrate, the electronic part obliquely protruding from an edge of the upper surface of the substrate.

21 Claims, 5 Drawing Sheets

LIGHT-EMITTING DEVICE AND LIGHTING APPLIANCE INCLUDING THE LIGHT-EMITTING DEVICE

CROSS-REFERENCE TO RELATED APPLICATION

This application is a new U.S. patent application that claims benefit of U.S. provisional application No. 62/155,660 filed on May 1, 2015, the disclosures of which are incorporated herein by reference in its entirety.

BACKGROUND OF THE INVENTION

Field of the Invention

The present invention relates to a light-emitting device including a substrate and a light-emitting element electrically connected to the substrate, and relates to a lighting appliance in which a light-emitting device is arranged.

Description of the Related Art

A conventional lighting appliance, which is an incandescent light bulb and/or a downlight including the conventional light bulb, for example, has been replaced by a lighting appliance including a light-emitting diode (LED) element as a light source.

For example, it is open to the public that a lighting appliance includes a light source including at least one LED element. (For reference, see U.S. Unexamined Patent Application Publication No. 2013/0294085 A1).

SUMMARY OF THE INVENTION

In a first aspect of the present inventive subject matter, a light-emitting device includes a substrate; a light-emitting element electrically connected to the substrate and arranged in a light-emitting area that is positioned on an upper surface of the substrate; and a first electronic part that is electrically connected to the substrate and arranged outside the light-emitting area on the upper surface of the substrate, the first electronic part obliquely protruding from an edge of the upper surface of the substrate.

Also, it is suggested that a plurality of light-emitting elements are arranged in the light-emitting area.

Furthermore, it is disclosed that the substrate and the first electronic part that is electrically connected to the substrate, arranged on the upper surface of the substrate, and obliquely protrudes from the edge of the upper surface of the substrate are arranged in a circular area. It is disclosed that the light-emitting area of the substrate is centered in the circular area.

In addition, it is disclosed that the first electronic part that is obliquely protruding from an edge of the upper surface of the substrate may be a capacitor.

Also, it is disclosed that the light-emitting device may further include a second electronic part including a driving circuit, electrically connected to the substrate, and arranged on the upper surface of the substrate.

In a second aspect of the present inventive subject matter, a light-emitting device includes a substrate including a first electrode and a second electrode; a light-emitting element electrically connected to the substrate and arranged in a light-emitting area that is positioned on an upper surface of the substrate; a first electronic part that is electrically connected to the substrate and arranged outside the light-emitting area on the upper surface of the substrate, the first electronic part obliquely protruding from an edge of the upper surface of the substrate; and a second electronic part that is electrically connected to the substrate and arranged on the upper surface of the substrate, and the light-emitting element is electrically connected to the first electrode and to the second electrode of the substrate via the first electronic part and the second electronic part.

Also, it is disclosed that the light-emitting device further includes a connector that is configured to be electrically connected to the first electrode and the second electrode of the substrate; and a rectifier that is configured to be electrically connected to the connector to convert alternating current to rectified current. Furthermore, it is disclosed that the first electronic part may include a capacitor, and the light-emitting element including a plurality of light-emitting elements that are arranged in the light-emitting area of the substrate and electrically connected to the first electrode and the second electrode of the substrate via the first electronic part, the second electronic part, and the rectifier.

In a third aspect of the present inventive subject matter, a lighting appliance includes a casing; and a light-emitting device arranged in the casing. It is suggested that the substrate of the light-emitting device has a rectangular shape, the first electronic part is electrically connected to the substrate of the light-emitting device, partly arranged on the upper surface of the substrate and obliquely protrudes from the edge of the upper surface of the substrate, and the substrate and the first electronic part obliquely protruding from the edge of the upper surface of the substrate are arranged in a circular area demarcated in the casing of the lighting appliance.

Also, it is disclosed that the light-emitting device may include a second electronic part that includes a driving circuit.

Furthermore, it is disclosed that the circular area may be in a range of 40 millimeter in diameter to 80 millimeter in diameter.

Also, it is disclosed that the light-emitting area of the substrate may occupy 20 to 30 percent of the circular area.

In addition, it is disclosed that the circular area may have a shape of circumcircle of the substrate that has a rectangular shape.

Also, it is disclosed that the circular area may be larger than an area of circumcircle of the substrate that has a rectangular shape.

Furthermore, it is disclosed that the circular area is surrounded by a tubular wall included in the casing.

Also, it is disclosed that the circular area is surrounded by a parabolic curving wall included in the casing.

DETAILED DESCRIPTION OF THE EMBODIMENTS

As used herein, the term "and/or" includes any and all combinations of one or more of the associated listed items.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As illustrated in the figures submitted herewith, some sizes of structures or portions may be exaggerated relative to other structures or portions for illustrative purposes. Relative terms such as "below" or "above" or "upper" or "lower" or "front" or "rear" or "side" may be used herein to describe a relationship of one element, portion, or area to another element, portion or area as illustrated in the figures. It will be understood that these terms are intended to encompass different orientations of a device and/or an appliance in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar and/or corresponding and/or related structures throughout. It should be noted that the drawings are schematic in nature.

Figure 1:
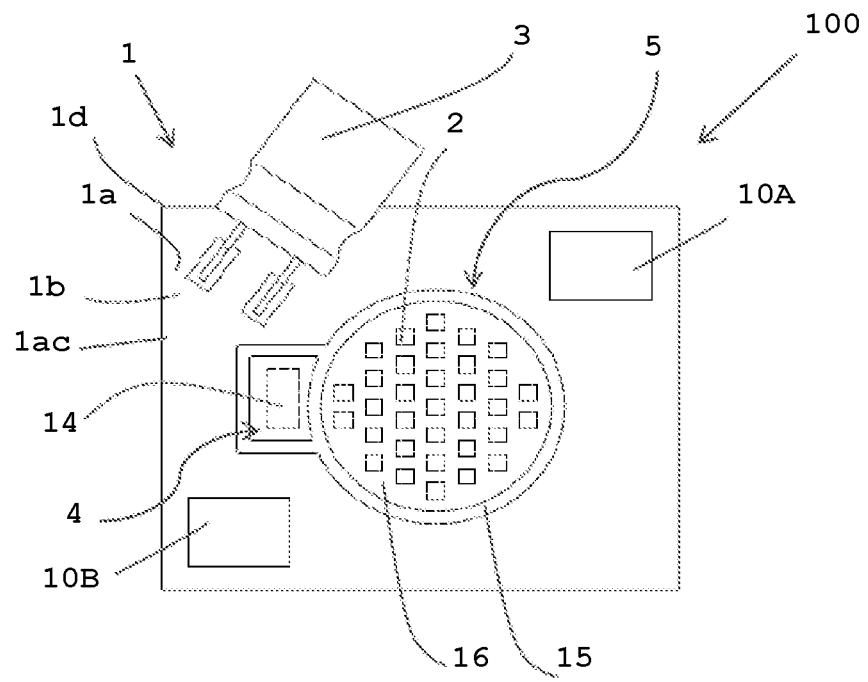
FIG. 1 shows a plan view of a first embodiment of a light-emitting device according to the present invention.

FIG. 1 shows a plan view of a first embodiment of a light-emitting device 100 according to the present invention.

A light-emitting device 100 includes a substrate 1, and a light-emitting element 2 electrically connected to the substrate 1. The light-emitting element 2 is arranged in a light-emitting area 5 that is positioned on an upper surface 1a of the substrate 1. The light-emitting device 100 may further include one or more electronic parts electrically connected to the substrate 1 and mounted on the upper surface 1a of the substrate 1. The light-emitting device 100 includes a first electronic part 3 that is electrically connected to the substrate 1 and arranged outside the light-emitting area 5 on the upper surface 1a of the substrate 1. The first electronic part 3 obliquely protrudes from an edge 1ac of the upper surface 1a of the substrate 1.

With this configuration, it is possible to utilize an outside area of the substrate 1 when the light-emitting device 100 is to be arranged in a circular area and the substrate 1 has a rectangular shape fitting in the circular area.

The first electronic part 3 may be partly adhered to the upper surface 1a of the substrate 1. The first electronic part 3 may be adhered to the upper surface 1a of the substrate 1 at a position adjacent to a corner 1d of the substrate 1. The electronic part 3, which is adhered to the upper surface 1a of the substrate 1 at the position adjacent to the corner 1d of the substrate 1, partly and obliquely protrudes from the edge 1ac of the upper surface 1a of the substrate 1.

Figure 2:
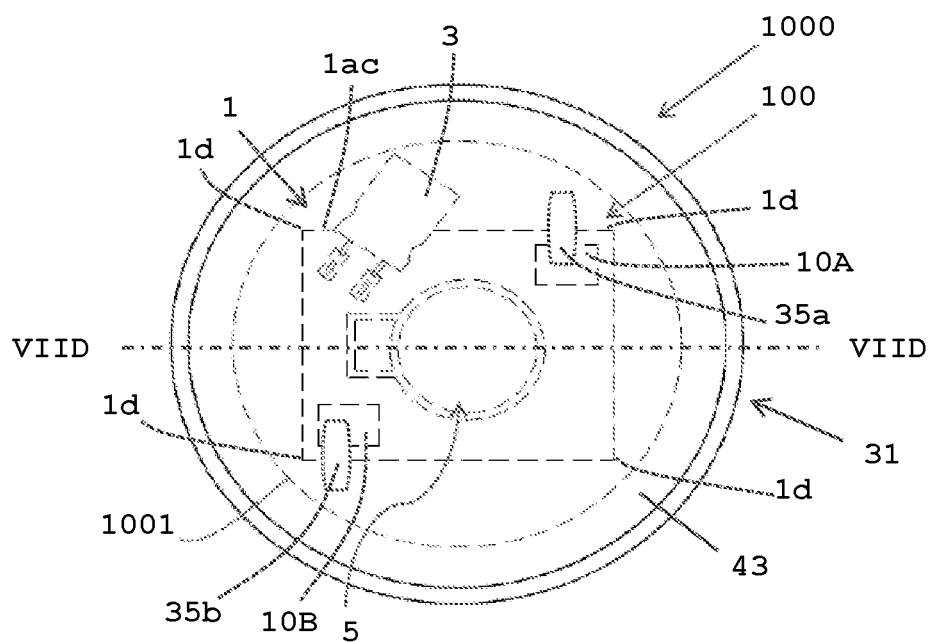
FIG. 2 shows a front view of a first embodiment of a lighting appliance according to the present invention.

FIG. 2 shows a front view of a first embodiment of a lighting appliance 1000 according to the present invention.

The light-emitting device 100 according to the first embodiment of the present invention is to be arranged in a circular area 1001 of a lighting appliance 1000.

The lighting appliance 1000 may be a downlight, which may be installed into a hollow opening in a ceiling, and/or a wall, for example.

Figure 7A:
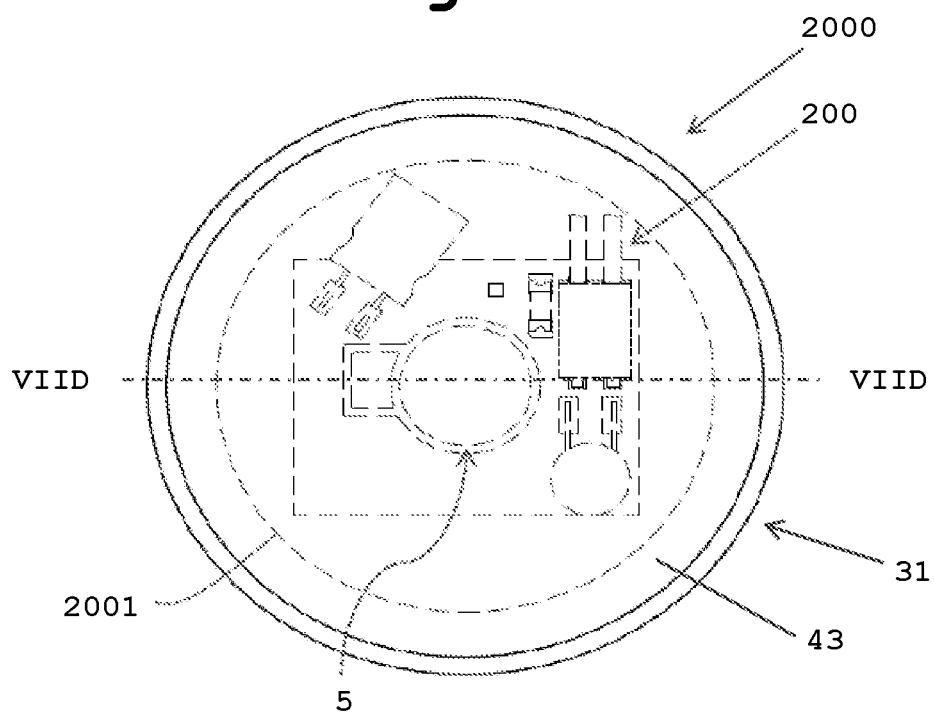
FIG. 7A shows a front view of a second embodiment of a lighting appliance according to the present invention.
Figure 7B:
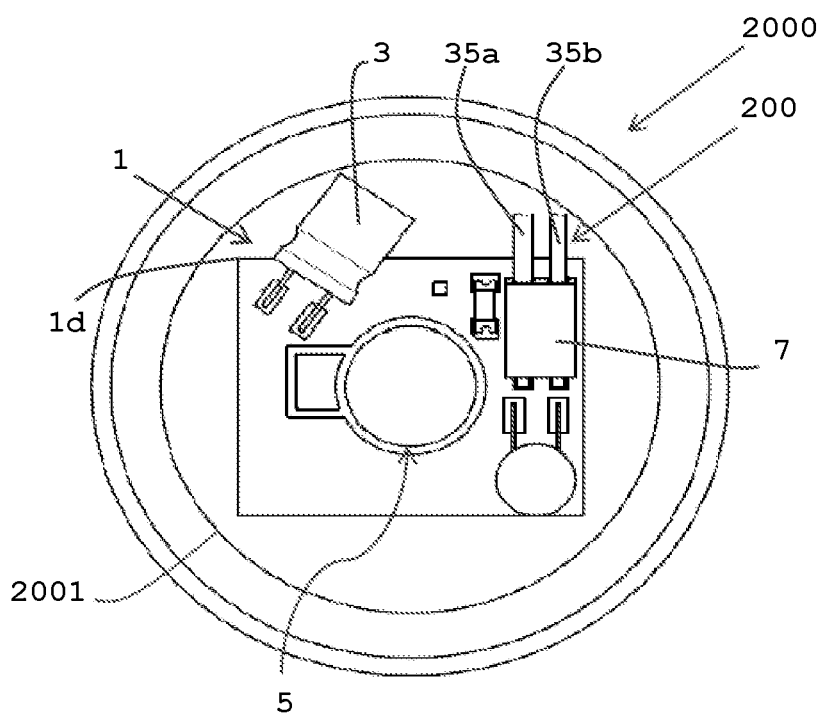
FIG. 7B shows the front view of the lighting appliance, which is shown in FIG. 7A, with a light-transmitting cover removed.
Figure 7C:
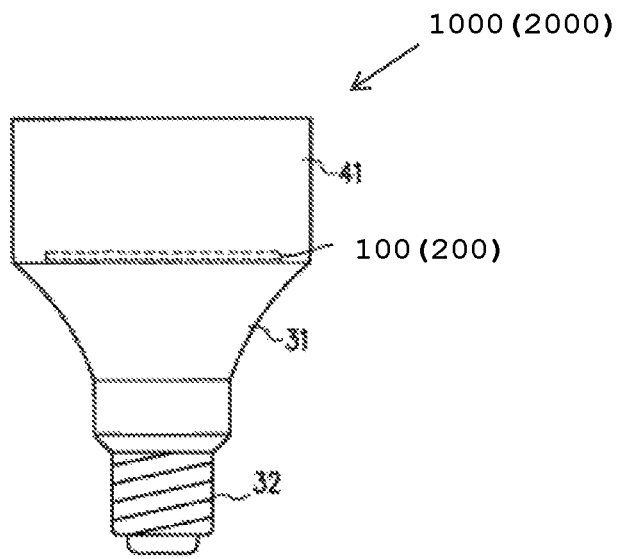
FIG. 7C shows a schematic side view of a lighting appliance, which is a light bulb according to an embodiment of the lighting appliance of the present invention.

Also, the lighting appliance 1000 may be a light bulb as shown in FIG. 7C, for example. There are standard size variations for the lighting appliance, and the circular area 1001 of the lighting appliance 1000 requires to be fit in the standard size variations of the lighting appliance.

Accordingly, the circular area in alighting appliance may be in a range of 40 millimeters in diameter to 80 millimeters in diameter, which appears to be small and limited.

Also, a substrate used in a light-emitting device usually has a rectangular shape when viewed from above, and to be arranged in the circular area 5.

The term "rectangular shape" herein includes a square shape. In addition, it is often required that the light-emitting area 5 of the substrate 1 is to be centered in the circular area 1001 of the lighting appliance 1000.

Furthermore, it is often required to electrically mount one or more electronic part 3, 14, for example, on the upper surface 1a of the substrate 1 of the light-emitting device in addition to the light-emitting elements 2 in the light-emitting area 5 of the substrate 1. Accordingly, utilizing space efficiently within the circular area in the lighting appliance is required.

The light-emitting area 5 of the substrate 1 may occupy 20 to 30 percent of the circular area 1001. The light-emitting device 100 according to the present invention shows a configuration utilizing a space outside the substrate 1 within the circular area 5 of the lighting appliance 1000.

The circular area 1001 in the lighting appliance 1000 may have a shape of circumcircle of the substrate 1 that has a rectangular shape. Also, the circular area 1001 in the lighting appliance 1000 may have a shape larger than an area of circumcircle of the substrate 1 of the light-emitting device 100 as shown in FIG. 2.

The light-emitting elements 2 may be flip chip LED elements arranged in the light-emitting area 5.

The light-emitting elements 2 may be electrically connected through bumps (not shown) to a first electrode pattern (not shown) and a second electrode pattern (not shown) arranged on the upper surface 1a of the substrate 1. The first electrode pattern may be electrically connected to the first electrode 10A of the substrate 1. The second electrode pattern may be electrically connected to the second electrode 10B of the substrate 1. An electrode pattern may be freely arranged on the substrate 1 considering an arrangement of light-emitting elements 2, positions of the first electrode 10A, the second electrode 10B, and/or one or more electronic parts electrically connected to the substrate 1, for example.

Figure 4:
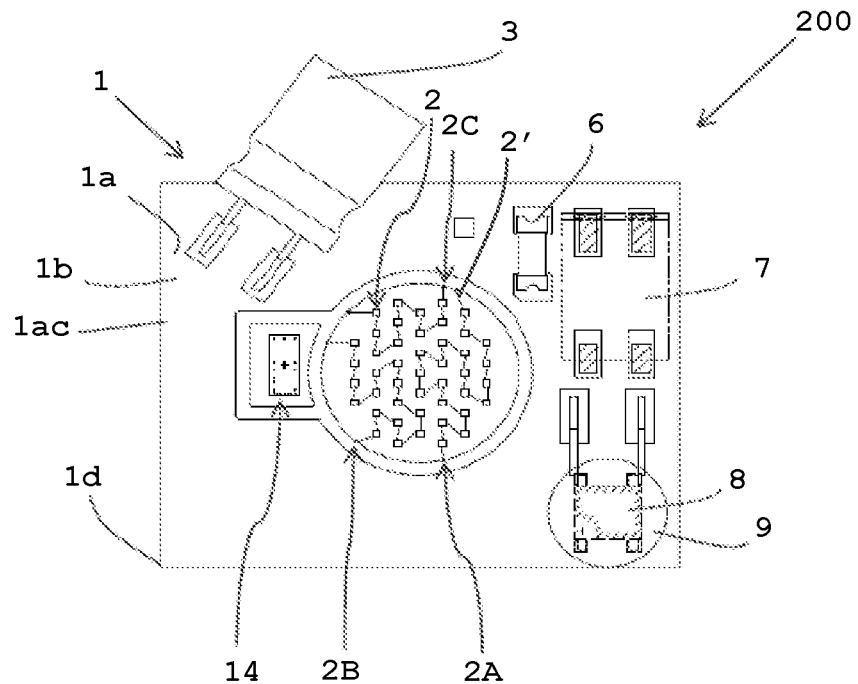
FIG. 4 shows a plan view of the light-emitting device shown in FIG. 3 with a light-transmitting resin, which seals light-emitting elements, removed from the light-emitting device.

Also, it is possible that the light-emitting elements may be electrically connected to the first electrode pattern and the second electrode pattern by metallic wires 2' as shown in FIG. 4. The first electrode pattern may be electrically connected to the first electrode 10A. The second electrode pattern may be electrically connected to the second electrode 10B.

The light-emitting device 100 may further include a second electronic part 14 including a driving circuit. The second electronic part 14 is electrically connected to the substrate 1, and arranged on the upper surface 1a of the substrate 1. The second electronic part 14 may be arranged on the upper surface 1a of the substrate at a position adjacent to the light-emitting elements 2 in the light-emitting area 5.

The light-emitting elements 2 may be sealed by a light-transmitting resin 16. The light-transmitting resin 16 may include a phosphor. The light-emitting area 5 may have a circular shape that is demarcated by an annular retainer 15, in which the light-transmitting resin 16 is filled. The light-transmitting resin 16 may contain a phosphor. The phosphor contained in the light-transmitting resin 16 in the light-emitting area 5 is selectable from phosphors that are excitable in response to light from the light-emitting element 2.

The second electronic part 14 may be arranged in an area 4 filled with a sealing resin, which may be the same material as the light-transmitting resin 16. The area 4, in which the second electronic part 14 is arranged, may be positioned adjacent to the light-emitting area 5. The second electronic part 14 may be an integrated circuit (IC) chip as the driving circuit.

The lighting appliance 1000 may include the light-emitting device 100 as a light source, for example.

The lighting appliance 1000 includes a casing 31, and the light-emitting device 100 that is arranged in the casing 31. The substrate 1 of the light-emitting device 100 has a rectangular shape. The first electronic part 3 is electrically connected to the substrate 1 of the light-emitting device 100. The first electronic part 3 is partly arranged on the upper surface 1a of the substrate 1 and obliquely protrudes from the edge 1ac of the upper surface 1a of the substrate 1. The substrate 1 and the first electronic part 3 that obliquely protrudes from the edge 1ac of the upper surface 1a of the substrate 1 are arranged in a circular area demarcated in the casing 31 of the lighting appliance 1000.

The first electronic part 3 may be a capacitor.

The circular area 1001 is defined in a casing of the lighting appliance 1000. The circular area 1001 may be surrounded by a tubular wall 41 included in the casing 31.

Also, the tubular wall 41 may have a reflector cup shape. The circular area 1001 may be surrounded by a parabolic curving wall included in the casing 31.

The lighting appliance 1000 may include a light-transmitting cover 43 arranged above the light-emitting device 100. The lighting appliance 1000 may further include a first lead wire 35a electrically connected to the first electrode 10A of the substrate 1 and a second lead wire 35b electrically connected to the second electrode 10B of the substrate 1 to supply current to the light-emitting elements 2 and electronic parts including the first electronic part 3 and the second electronic part 14 that are electrically arranged on the substrate 1. The first lead wire 35a may be soldered on the first electrode 10A of the substrate 1. The second lead wire 35b may be soldered on the second electrode 10B of the substrate 1.

Figure 3:
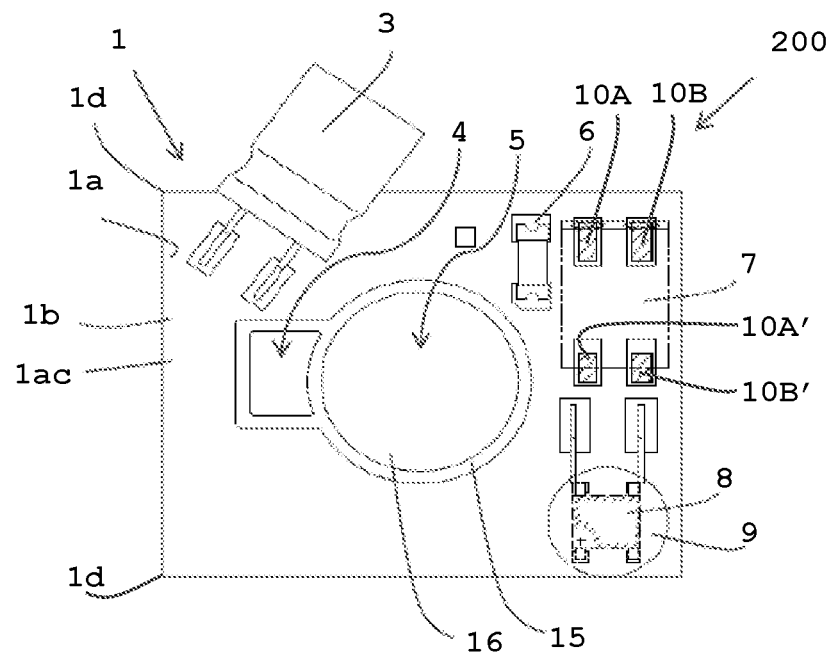
FIG. 3 shows a plan view of a light-emitting device according to a second embodiment of the present invention.

FIG. 3 shows a plan view of a light-emitting device 200 according to a second embodiment of the present invention. The light-emitting device 200 includes a substrate 1, and a light-emitting element 2 electrically connected to the substrate 1. The light-emitting element 2 is arranged in a light-emitting area 5 that is positioned on an upper surface 1a of the substrate 1. The light-emitting device 200 may further include one or more electronic parts. The light-emitting device 200 may include a first electronic part 3 that is electrically connected to the substrate 1 and arranged outside the light-emitting area 5 on the upper surface 1a of the substrate 1. The first electronic part 3 obliquely protrudes from an edge 1ac of the upper surface 1a of the substrate 1.

The first electronic part 3 is partly adhered to the upper surface 1a of the substrate 1. The first electronic part 3 may be adhered to the upper surface 1a of the substrate 1 at a position adjacent to a corner 1d of the substrate 1. The first electronic part 3, which is adhered to the upper surface 1a of the substrate 1 at the position adjacent to the corner 1d of the substrate 1, partly and obliquely protrudes from the edge 1ac of the upper surface 1a of the substrate 1.

Since the light-emitting area 5 is positioned at a center position of the upper surface 1a of the substrate 1, the first electronic part 3 is electrically connected to an electrode pattern that is arranged adjacent to a corner 1d of the substrate 1 on the upper surface 1a of the substrate 1. The first electronic part 3 may be electrically connected to the first electrode 10A and the second electrode 10B via the electrode pattern on the substrate 1. The electrode pattern may include a pair of electrode patterns. The first electronic part 3 that is positioned adjacent to the corner 1d of the substrate 1 obliquely protrudes from an edge 1ac of the upper surface 1a of the substrate 1. The light-emitting device 200 further includes a second electronic part 14. Also, the light-emitting element 2 is electrically connected to a first electrode 10A and a second electrode 10B via an electrode pattern arranged on the substrate 1. The electrode pattern may include a pair of electrode patterns.

FIG. 4 shows a plan view of the light-emitting device 200 shown in FIG. 3 with a light-transmitting resin 16, which seals light-emitting elements 2, removed from the light-emitting device 200. The arrangement of light-emitting elements 2 shown in FIG. 4 is just an example. The light-emitting elements 2 may be electrically connected to the electrode pattern by metallic wires 2'.

Also, the light-emitting elements 2 may be flip chip LED elements electrically connected through bumps to a first electrode pattern and a second electrode pattern on the upper surface 1a of the substrate 1. The first electrode pattern may be electrically connected to the first electrode 10A. The second electrode pattern may be electrically connected to the second electrode 10B.

Figure 5:
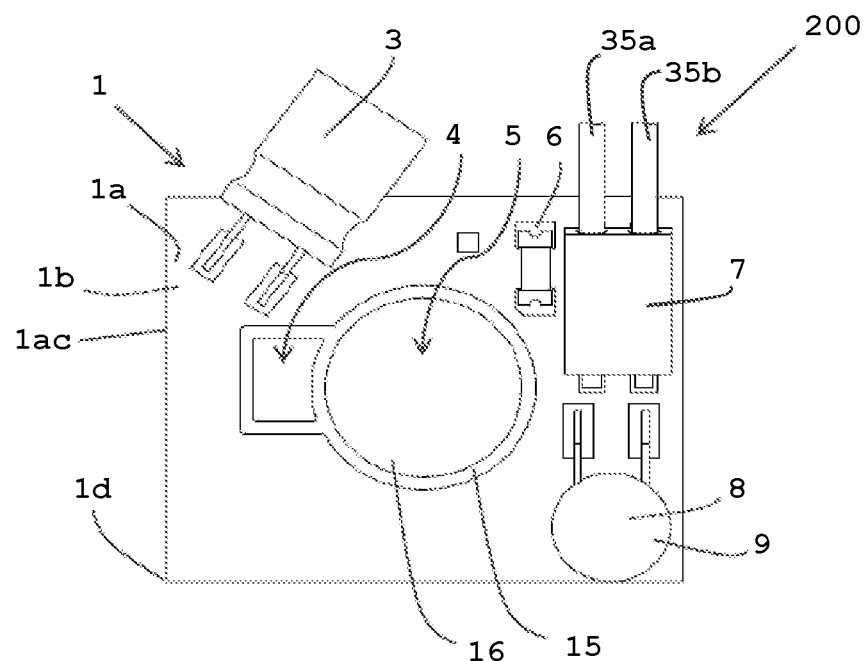
FIG. 5 shows a plan view of a light-emitting device with a connector soldered on the first electrode and the second electrode of the substrate according to the second embodiment of the present invention.

FIG. 5 shows a plan view of a light-emitting device with a connector 7 soldered on the first electrode 10A and the second electrode 10B of the substrate 1 according to the second embodiment of the present invention. The light-emitting device 200 further comprises the connector 7 that is configured to be electrically connected to the first electrode 10A and the second electrode 10B of the substrate 1 to supply current to a light-emitting element 2 and one or more electronic part that are electrically mounted on the substrate 1. The connector 7 is configured to be electrically connected to a power source 70 that is positioned outside of the light-emitting device 200.

Figure 6:
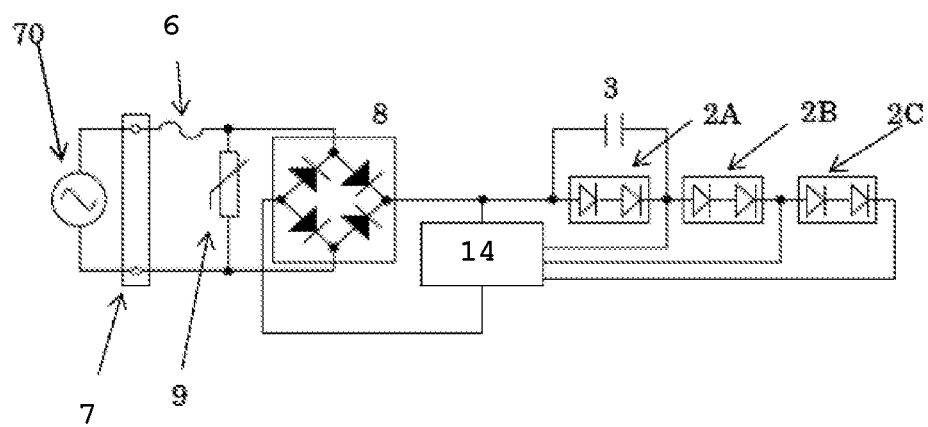
FIG. 6 shows a circuit diagram example for a light-emitting device shown in FIG. 5.

FIG. 6 shows a circuit diagram example for a light-emitting device shown in FIG. 5.

The light-emitting device 200 further includes a connector 7 that is configured to be electrically connected to the first electrode 10A and the second electrode 10B of the substrate 1. The connector 7 may include a first lead wire 35a and a second lead wire 35b. The connector 7 may be soldered on the first electrode 10A and the second electrode 10B. The first electrode of the substrate 1 may include one or more electrodes 10A, 10A', which can be used for electrical connection and/or soldering the connector 7 onto the substrate 1. Also, the second electrode of the substrate 1 may include one or more electrodes 10B, 10B', which can be used for electrical connection and/or soldering the connector 7 onto the substrate 1.

The light-emitting device 200 further includes a rectifier 8 that is configured to be electrically connected to the connector 7 to convert alternating current, which is to be supplied via the connector 7 from the outside of the light-emitting device 200, to rectified current.

Also, the first electronic part 3 may include a capacitor. The light-emitting elements 2 that are arranged in the light-emitting area 5 of the substrate 1 are electrically connected to the first electrode 10A and the second electrode 10B of the substrate 1 via the first electronic part 3 and the second electronic part 14.

In this embodiment, the first electronic part 3 that is a capacitor 3 is arranged on the upper surface 1a of the substrate 1 and electrically connected in parallel to a first array 2A in which twenty light-emitting elements 2 are electrically connected in series by metallic wires 2'. Also, there are a second array 2B in which fifteen light-emitting elements 2 are electrically connected in series by metallic wires 2' and a third array 2C in which ten light-emitting elements 2 are electrically connected in series by metallic wires 2'. The first array 2A, the second array 2B and the third array 2C are electrically connected in series in the circuit diagram in FIG. 6. Of course, the number of the light-emitting elements 2 in the array can be freely selectable and the number of the arrays also can be freely selectable. Each array may be electrically connected to a bypass circuit included in the driving circuit. The third array 2C may be electrically connected to a current limiting circuit included in the driving circuit.

A fuse 6 may be electrically arranged between the connector 7 and a varistor 9, which may be arranged on the upper surface 1a of the substrate 1and electrically positioned between the connector 7 and a rectifier 8.

FIG. 7A shows a front view of a second embodiment of a lighting appliance 2000 according to the present invention. The lighting appliance 2000 includes the light-emitting device 200, for example. The lighting appliance 2000 may be a downlight, which may be installed into a hollow opening in a ceiling, and/or a wall, for example. Also, the lighting appliance 2000 may be a light bulb shown in FIG. 7C, for example.

FIG. 7B shows the front view of the light-emitting portion of the lighting appliance, which is shown in FIG. 7A, with a light-transmitting cover 43 removed. The light-transmitting cover 43 covers the light-emitting area 5 of the light-emitting device 200 from above.

The lighting appliance 2000 includes a casing 31, and the light-emitting device 200 arranged in the casing 31. The substrate 1 has a rectangular shape. The first electronic part 3 is electrically connected to the substrate 1 of the light-emitting device 200. The first electronic part 3 partly arranged on the upper surface 1a of the substrate 1 and obliquely protrudes from the edge 1ac of the upper surface 1a of the substrate 1 and the substrate 1 are arranged in a circular area 2001 demarcated in the casing 31 of the lighting appliance 2000.

The circular area 2001 that is in a range of 40 millimeter in diameter to 80 millimeter in diameter may be larger than an area of circumcircle of the substrate 1 of the light-emitting device 200.

FIG. 7C shows a schematic side view of a lighting appliance, which is a light bulb according to an embodiment of the lighting appliance of the present invention. The light-emitting device 200 is arranged in the casing 31 under a light-transmitting cover 43. The lighting appliance 1000 (2000) may include a base 32.

Also, the lighting appliance may be a downlight in a ceiling or in a wall. The circular area 2001 may be surrounded by a tubular wall 41 included in the casing 31. Also, the tubular wall 41 may have a reflector cup shape surrounding the circular area 2001. The tubular wall 41 may include a step portion 41a at an upper portion of the tubular wall 41. The step portion 41a may be an annular step portion on which a peripheral portion 45 of the light-transmitting cover 43 may be supported.

Figure 7D:
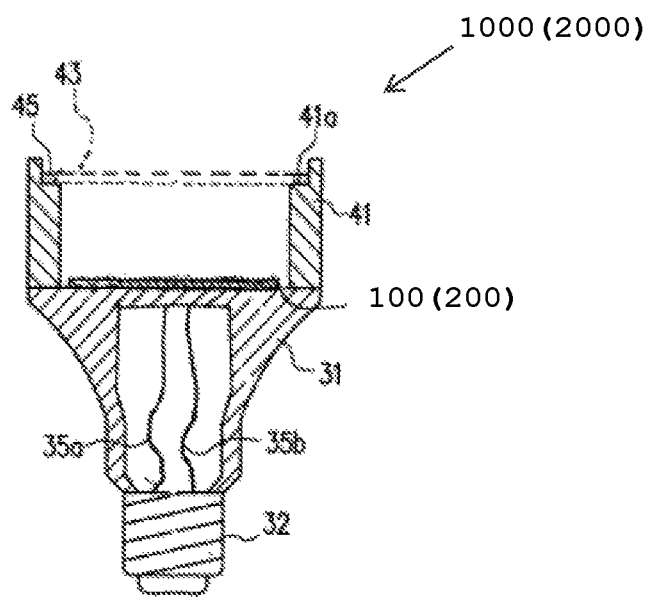
FIG. 7D shows a schematic cross-sectional view of a light bulb as an embodiment of the lighting appliance of the present invention, taken along a dotted and dashed line VIID-VIID shown in FIG. 2 or FIG. 7A, for example.

FIG. 7D shows a schematic cross-sectional view of a light bulb as an embodiment of the lighting appliance of the present invention, taken along a dotted and dashed line VIID-VIID shown in FIG. 2 or FIG. 7A, for example.

FIG. 7D shows a first lead wire 35a that may be soldered on the first electrode 10A of the substrate 1 and a second lead wire 35b that may be soldered on the second electrode 10B of the substrate 1 of the light-emitting device 100 shown in FIG. 2.

Also, FIG. 7D shows a first lead wire 35a that may be extended from the connector 7 and a second lead wire 35b that may be extended from the connector 7 shown in the light-emitting device 200 of FIG. 5. The first lead wire 35a and the second lead wire 35b are configured to be electrically connected to the substrate 1 via the connector 7 soldered on the first electrode 10A and the second electrode 10B of the substrate 1.

In alternating current (AC), the flow of electric charge periodically reverses direction. AC is the form in which electric power is delivered to businesses and residences, and thus, an alternating current (AC) power source 70 is positioned outside of the light-emitting device 100 (200) and the lighting appliance 1000(2000) and supplied to the light-emitting device 100 via the first lead wire 35a and the second lead wire 35b.

The rectifier 8 is configured to rectify an AC originating from the AC power source 70 to supply a rectified current to the light light-emitting elements 2 and one or more electronic parts.

The light-emitting device 200 may include a fuse 6 and a varistor 9. A fuse is a device used in an electrical device and/or system to protect against an excessive current. A varistor is an electronic component with an electrical resistivity that varies with a voltage applied.

The light-transmitting cover 43 may be a lens. Also, the light-transmitting cover 43 may include a curving shape.

Also, the base 32 may be a screw base. The shape of the base 32 may be various shapes compatible to sockets which are already known and used.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A light-emitting device comprising:
   a substrate;
   a light-emitting element electrically connected to the substrate and arranged in a light-emitting area that is positioned on an upper surface of the substrate; and
   a first electronic part that is electrically connected to the substrate and arranged outside the light-emitting area on the upper surface of the substrate, the first electronic part obliquely protruding from an edge of the upper surface of the substrate.

2. The light-emitting device according to claim 1, wherein the light-emitting element comprises a plurality of light-emitting elements that are arranged in the light-emitting area.

3. The light-emitting device according to claim 2, wherein the light-emitting area has a circular shape that is demarcated by an annular retainer in which a light-transmitting resin is filled.

4. The light-emitting device according to claim 1, wherein the substrate and the first electronic part that is electrically connected to the substrate, arranged on the upper surface of the substrate, and obliquely protrudes from the edge of the upper surface of the substrate are arranged in a circular area, and
   wherein the light-emitting area of the substrate is centered in the circular area.

5. The light-emitting device according to claim 4, wherein the circular area is in a range of 40 millimeter in diameter to 80 millimeter in diameter.

6. The light-emitting device according to claim 5, wherein the light-emitting area of the substrate occupies 20 to 30 percent of the circular area.

7. The light-emitting device according to claim 5, wherein the circular area has a shape of circumcircle of the substrate that has a rectangular shape.

8. The light-emitting device according to claim 5, wherein the circular area is larger than an area of circumcircle of the substrate that has a rectangular shape.

9. The light-emitting device according to claim 1, wherein the first electronic part that is obliquely protruding from the edge of the upper surface of the substrate is a capacitor.

10. The light-emitting device according to claim 9, further comprising:
    a second electronic part including a driving circuit, electrically connected to the substrate, and arranged on the upper surface of the substrate.

11. A light-emitting device comprising:
    a substrate comprising a first electrode and a second electrode;
    a light-emitting element electrically connected to the substrate and arranged in a light-emitting area that is positioned on an upper surface of the substrate;
    a first electronic part that is electrically connected to the substrate and arranged outside the light-emitting area on the upper surface of the substrate, the first electronic part obliquely protruding from an edge of the upper surface of the substrate; and
    a second electronic part that is electrically connected to the substrate and arranged on the upper surface of the substrate,
    wherein the light-emitting element is electrically connected to the first electrode and to the second electrode of the substrate via the first electronic part and the second electronic part.

12. The light-emitting device according to claim 11, further comprising:
    a connector that is configured to be electrically connected to the first electrode and the second electrode of the substrate; and
    a rectifier that is configured to be electrically connected to the connector to convert alternating current to rectified current,
    wherein the first electronic part comprises a capacitor, and
    wherein the light-emitting element comprises a plurality of light-emitting elements that are arranged in the light-emitting area of the substrate and electrically connected to the first electrode and the second electrode of the substrate via the first electronic part, the second electronic part, and the rectifier.

13. The light-emitting device according to claim 11, wherein the light-emitting element comprises a plurality of light-emitting elements arranged in the light-emitting area that are sealed by a light-transmitting resin.

14. A lighting appliance comprising:
    a casing; and
    a light-emitting device comprising:
       a substrate;
       a light-emitting element electrically connected to the substrate and arranged in a light-emitting area that is positioned on an upper surface of the substrate; and
       a first electronic part that is electrically connected to the substrate and arranged outside the light-emitting area on the upper surface of the substrate, the first electronic part being partly arranged on the upper surface of the substrate and obliquely protruding from an edge of the upper surface of the substrate,
    wherein the light-emitting device is arranged in the casing,
    wherein the substrate of the light-emitting device has a rectangular shape, and
    wherein the substrate and the first electronic part obliquely protruding from the edge of the upper surface of the substrate are arranged in a circular area demarcated in the casing of the lighting appliance.

15. A lighting appliance comprising:
    a casing; and
    a light-emitting device comprising:
       a substrate comprising a first electrode and a second electrode;
       a light-emitting element electrically connected to the substrate and arranged in a light-emitting area that is positioned on an upper surface of the substrate;
       a first electronic part that is electrically connected to the substrate and arranged outside light-emitting area and partly on the upper surface of the substrate, the first electronic part obliquely protruding from an edge of the upper surface of the substrate; and a second electronic part that is electrically connected to the substrate and arranged on the upper surface of the substrate, wherein light-emitting element is electrically connected to the first electrode and to the second electrode of the substrate via the first electronic part and the second electronic part, wherein light-emitting device is arranged in the casing, wherein the substrate of light-emitting device has a rectangular shape, and wherein the substrate and the first electronic part obliquely protruding from the edge of the upper surface of the substrate are arranged in a circular area demarcated in the casing of the lighting appliance.

16. The lighting appliance according to claim 15, wherein the circular area that is in a range of 40 millimeter in diameter to 80 millimeter in diameter is larger than an area of circumcircle of the substrate.

17. The lighting appliance according to claim 15, wherein the lighting appliance is a light bulb.

18. The lighting appliance according to claim 15, wherein the lighting appliance is a downlight.

19. The lighting appliance according to claim 15, wherein the circular area is surrounded by a tubular wall included in the casing.

20. The lighting appliance according to claim 15, wherein the circular area is surrounded by a parabolic curving wall included in the casing.

21. The lighting appliance according to claim 15, further comprising:
   a first lead wire soldered on the first electrode of the substrate; and
   a second lead wire soldered on the second electrode of the substrate.

* * * * *